United States Patent
Wu et al.

(10) Patent No.: US 8,386,551 B2
(45) Date of Patent: Feb. 26, 2013

(54) DYNAMIC FILTERING DEVICE AND METHOD THEREOF

(75) Inventors: Hung-Wei Wu, Taipei County (TW); Chiung-Fu Chen, Peng Hu County (TW); Shao-Sheng Yang, Kao Hsiung (TW); Chih-Yu Chang, Hsin Chu (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 481 days.

(21) Appl. No.: 12/824,717

(22) Filed: Jun. 28, 2010

(65) Prior Publication Data

US 2011/0119320 A1    May 19, 2011

(30) Foreign Application Priority Data

Nov. 18, 2009 (TW) ................................. 98139073 A

(51) Int. Cl.
*G06F 17/10* (2006.01)
(52) U.S. Cl. ...................................................... 708/322

(58) Field of Classification Search .................. None
See application file for complete search history.

(56) References Cited

U.S. PATENT DOCUMENTS

| | | | | |
|---|---|---|---|---|
| 5,270,954 A | * | 12/1993 | Sakata ........................ | 708/322 |
| 5,553,014 A | * | 9/1996 | De Leon et al. .............. | 708/322 |
| 6,970,896 B2 | * | 11/2005 | Awad et al. .................. | 708/322 |
| 7,958,176 B2 | * | 6/2011 | Douceur et al. .............. | 708/300 |
| 2003/0074381 A1 | * | 4/2003 | Awad et al. .................. | 708/322 |
| 2003/0084079 A1 | * | 5/2003 | Awad et al. .................. | 708/322 |
| 2011/0119320 A1 | * | 5/2011 | Wu et al. ...................... | 708/235 |

* cited by examiner

*Primary Examiner* — David H Malzahn
(74) *Attorney, Agent, or Firm* — Muncy, Geissler, Olds & Lowe, PLLC

(57) ABSTRACT

A dynamic filtering device includes a variation detector, a coefficient generator and a filter. The cut-off frequency of the filter is dynamically adjusted according to variations of an input signal. A higher signal-to-noise ratio is obtained when a finger moves in slow motion and its response time is reduced when the finger moves in fast motion, therefore improving the response time and the noise immunity of the filter.

26 Claims, 14 Drawing Sheets

| FC/FS (π) | 0.1 | 0.2 | 0.3 | 0.4 | 0.5 | 0.6 | 0.7 | 0.8 | 0.9 |
|---|---|---|---|---|---|---|---|---|---|
| a(1) | 1.0000 | 1.0000 | 1.0000 | 1.0000 | 1.0000 | 1.0000 | 1.0000 | 1.0000 | 1.0000 |
| a(2) | -1.8090 | -1.6099 | -1.3967 | -1.1605 | -0.8889 | -0.5634 | -0.1558 | 0.3773 | 1.0928 |
| a(3) | 0.8272 | 0.6794 | 0.5496 | 0.4344 | 0.3333 | 0.2509 | 0.2011 | 0.2210 | 0.4063 |
| b(1) | 0.0955 | 0.0996 | 0.1119 | 0.1334 | 0.1667 | 0.2172 | 0.2952 | 0.4207 | 0.6326 |
| b(2) | -0.1727 | -0.1297 | -0.0708 | 0.0072 | 0.1111 | 0.2530 | 0.4548 | 0.7570 | 1.2339 |
| b(3) | 0.0955 | 0.0996 | 0.1119 | 0.1334 | 0.1667 | 0.2172 | 0.2952 | 0.4207 | 0.6326 |

FIG. 6B

| FC/FS (π) | 0.1 | 0.2 | 0.3 | 0.4 | 0.5 | 0.6 | 0.7 | 0.8 | 0.9 |
|---|---|---|---|---|---|---|---|---|---|
| b(1) | 0.0338 | 0.0284 | 0.0201 | 0.0101 | 0.0000 | -0.0082 | -0.0127 | -0.0124 | -0.0075 |
| b(2) | 0.2401 | 0.2370 | 0.2309 | 0.2203 | 0.2037 | 0.1793 | 0.1458 | 0.1033 | 0.0536 |
| b(3) | 0.4521 | 0.4692 | 0.4981 | 0.5391 | 0.5926 | 0.6579 | 0.7338 | 0.8181 | 0.9079 |
| b(4) | 0.2401 | 0.2370 | 0.2309 | 0.2203 | 0.2037 | 0.1793 | 0.1458 | 0.1033 | 0.0536 |
| b(5) | 0.0338 | 0.0284 | 0.0201 | 0.0101 | 0.0000 | -0.0082 | -0.0127 | -0.0124 | -0.0075 |

FIG. 10B

DYNAMIC FILTERING DEVICE AND METHOD THEREOF

This application claims the benefit of the filing date of Taiwan Application Ser. No. 098139073, filed on Nov. 18, 2009, the content of which is incorporated herein by reference.

BACKGROUND OF THE INVENTION

1. Field of the Invention

The invention relates to a filter, particularly to a dynamic filtering device and method thereof.

2. Description of the Related Art

In order to improve signal quality, a low-pass filter is usually introduced to eliminate noise when a circuit receives a time-variant signal to perform circuit measurement. In the process of digital signal processing, the low-pass filter can be implemented with a finite impulse response (FIR) filter or an infinite impulse response (IIR) filter. In general, the stability of FIR filters is better than that of IIR filters, but the noise immunity of the IIR filters is better than that of the FIR filters. With the same filtered result or performance, the hardware cost of the IIR filter is usually lower than that of the FIR filter.

However, response times of conventional filters vary with frequencies. The better the noise immunity the longer the response time will be, as shown in FIG. 1A. By contrast, when a short response time is required for a system, such as a touch panel performing position detection, the noise immunity will be sacrificed to gain the shorter response time as shown in FIG. 1B, where a touch position D (x, y) is a function of a x-coordinate and a y-coordinate. Therefore, conventional circuit designers believe that the response time needs to be traded off for the noise immunity in filter design.

SUMMARY OF THE INVENTION

In view of the above-mentioned problems, an object of the invention is to provide a dynamic filtering device, whose cut-off frequency is dynamically adjusted according to variations of its input signal.

According to one embodiment of the invention, a dynamic filtering device is provided. The dynamic filtering device comprises a variation detector, a coefficient generator and a filter. The variation detector generates a detection value according to a plurality of consecutive samples of a first signal. The coefficient generator generates a corresponding set of filter coefficients according to the detection value. The filer performs filtering operations on the first signal in accordance with the corresponding set of filter coefficients. Here, the detection value is a linear combination of a variation of the plural consecutive samples, a variation of first derivatives of the plural consecutive samples and an average of the first derivatives of the plural consecutive samples. And, a magnitude of a cut-off frequency of the filter is related to the corresponding set of filter coefficients.

According to another embodiment of the invention, a dynamic filtering method is provided. The dynamic filtering method comprises the following steps. At first, a detection value according to a plurality of consecutive samples of a first signal is obtained. Then, a corresponding set of filter coefficients according to the detection value is obtained. Thereafter, a filter is used to perform filtering operations on the first signal in accordance with the corresponding set of filter coefficients. Here, the detection value is a linear combination of a variation of the plural consecutive samples, a variation of first derivatives of the plural consecutive samples and an average of the first derivatives of the plural consecutive samples. And, a magnitude of a cut-off frequency of the filter is related to the corresponding set of filter coefficients.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 6B shows an example of a second lookup table.

FIG. 10B shows another example of the second lookup table.

DETAILED DESCRIPTION OF THE INVENTION

In the present disclosure, numerous specific details are provided, such as examples of electrical circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

The invention takes a touch panel performing position detection as an example for explanation. However, a dynamic filtering device and method thereof according to the invention can also be applied in other integrated circuits that need filtering operations.

According to the invention, the cut-off frequency of a filter is dynamically varied according to speed variations, or/and position variations or/and an average speed of its input signal. The input signal has a higher signal-to-noise ratio (SNR) when a finger moves in slow motion and the response time is reduced when the finger moves in fast motion, thus improving the response time and the noise immunity of the filter.

Figure 2:
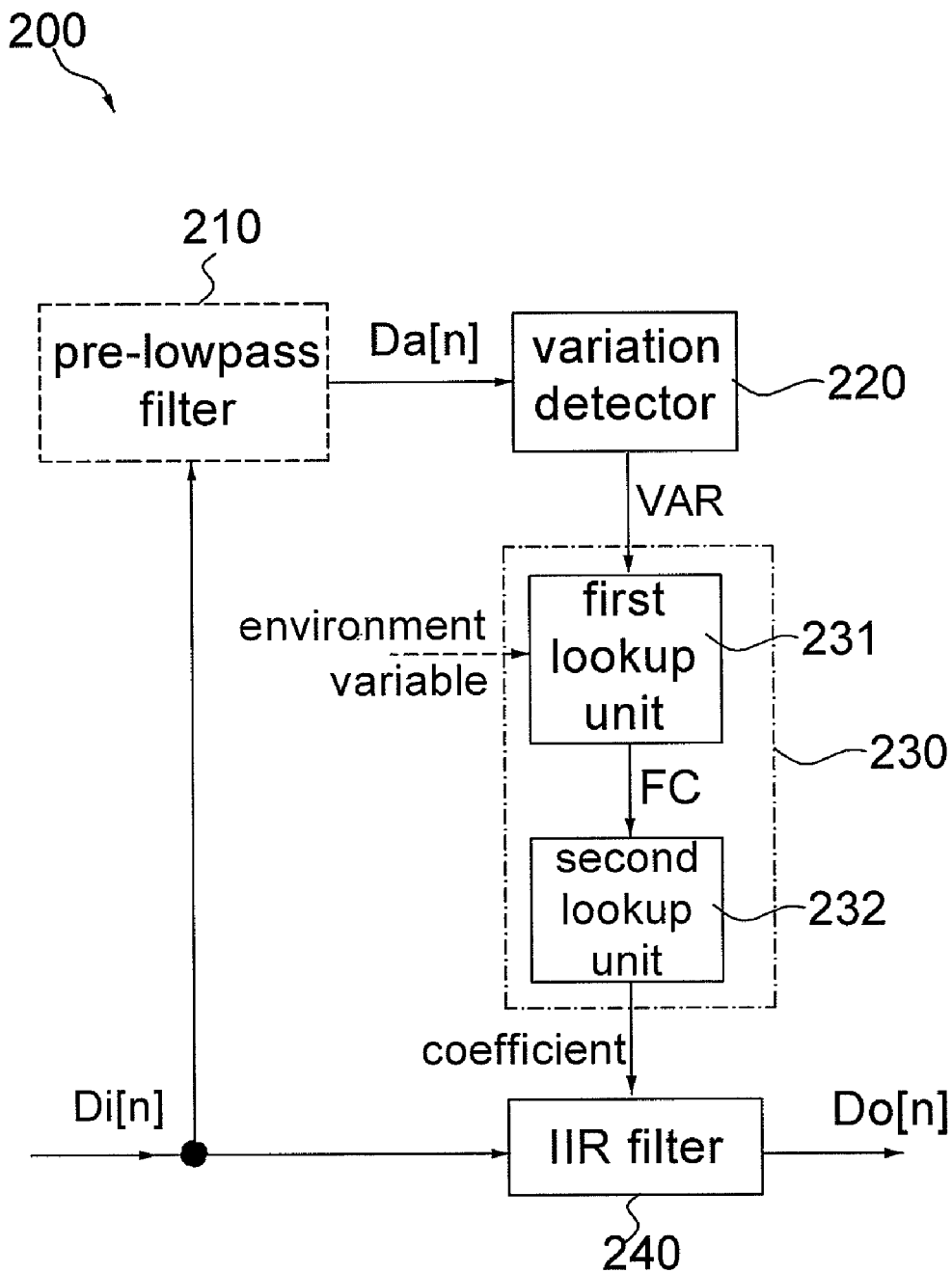
FIG. 2 shows a block diagram of a dynamic IIR filtering device according to an embodiment of the invention.

FIG. 2 shows a block diagram of a dynamic IIR filtering device according to an embodiment of the invention. Referring to FIG. 2, a dynamic IIR filtering device 200 of the invention includes a pre-lowpass filter 210, a variation detector 220, a coefficient generator 230 and an IIR filter 240. An input signal Di[n] of the dynamic IIR filtering device 200 represents a touch position of the finger placed on the touch panel. The input signal Di[n], a digital signal, denotes its sampled value at uniform intervals t=n×T where T is the interval between time samples and n is an integer larger than or equal to 0. For example, when a sampling frequency is 60 Hz, T is 1/60 second. Di[0] describes the sampled value of the input signal at t=0 second, Di[1] describes the sampled value of the input signal at t=1/60 seconds, Di[2] describes the sampled value of the input signal at t=(2×(1/60)) seconds, and so on. Di[n−1] describes the sampled value of the input signal at t=((n−1)×(1/60)) seconds. Correspondingly, Do[n] denotes the sampled value of an output signal of the dynamic IIR filter device 200 at uniform intervals t=n×T.

After receiving an input signal Di[n], the pre-lowpass filter 210 eliminates noise to generate a filtered signal Da[n] for the use of the variation detector 220 in the next stage. The pre-lowpass filter 210 can be implemented with an IIR filter or a FIR filter. For example, the input signal Di[n] represents the touch position of the finger placed on the touch panel and assuming that the sampling frequency is 60 Hz and the pre-low-pass filter 210 is implemented with a Chebyshev type 2 IIR filter. The Chebyshev type 2 IIR filter has a cut-off frequency of $FC_0$=0.6×FS, where FS is a half of the sampling frequency, i.e. FS=30 Hz. The motion frequency of the finger is usually below 20 Hz, so the cut-off frequency $FC_0$ is roughly set to (0.6×FS). For the dynamic IIR filtering device 200, the installation of the pre-low-pass filter 210 reduces the noise interference to the input signal Di[n] and thus increases the accuracy of the variation detector 220 in the next stage. On the contrary, if operating without the pre-low-pass filter 210, the dynamic IIR filtering device 200 can still perform dynamic filtering operations, but the detection value VAR from the variation detector 220 will be subject to noise interference. Since the pre-low-pass filter 210 is optional for the dynamic IIR filtering device 200, it is represented in dotted lines in FIG. 2.

Figure 3:
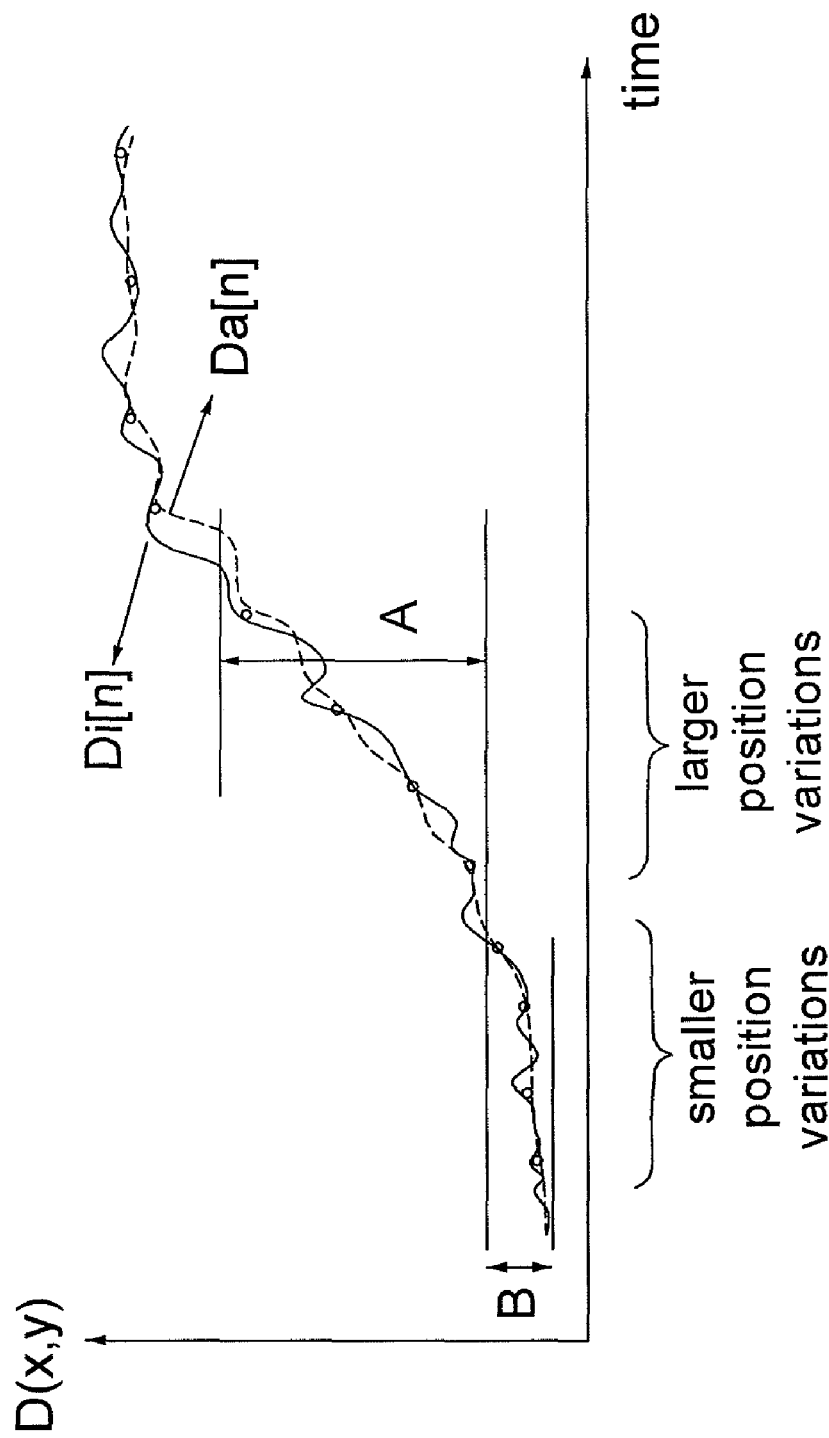
FIG. 3 shows how a finger touch position is varied with respect to time.

FIG. 3 shows how a finger touch position is varied with respect to time. Referring to FIG. 3, a solid line represents the original input signal Di[n] while a dotted line represents a signal Da[n] whose noise has been filtered out by the pre-low-pass filter 210. As can be observed from FIG. 3, the input signal Di[n] has smaller position variations ΔD in the region B, so a lower cut-off frequency is used to filter out more noise. By contrast, the position variations ΔD in the region A of the input signal Di[n] is larger, so a higher cut-off frequency is used to promptly respond to the variations of the input signal.

Figure 4:
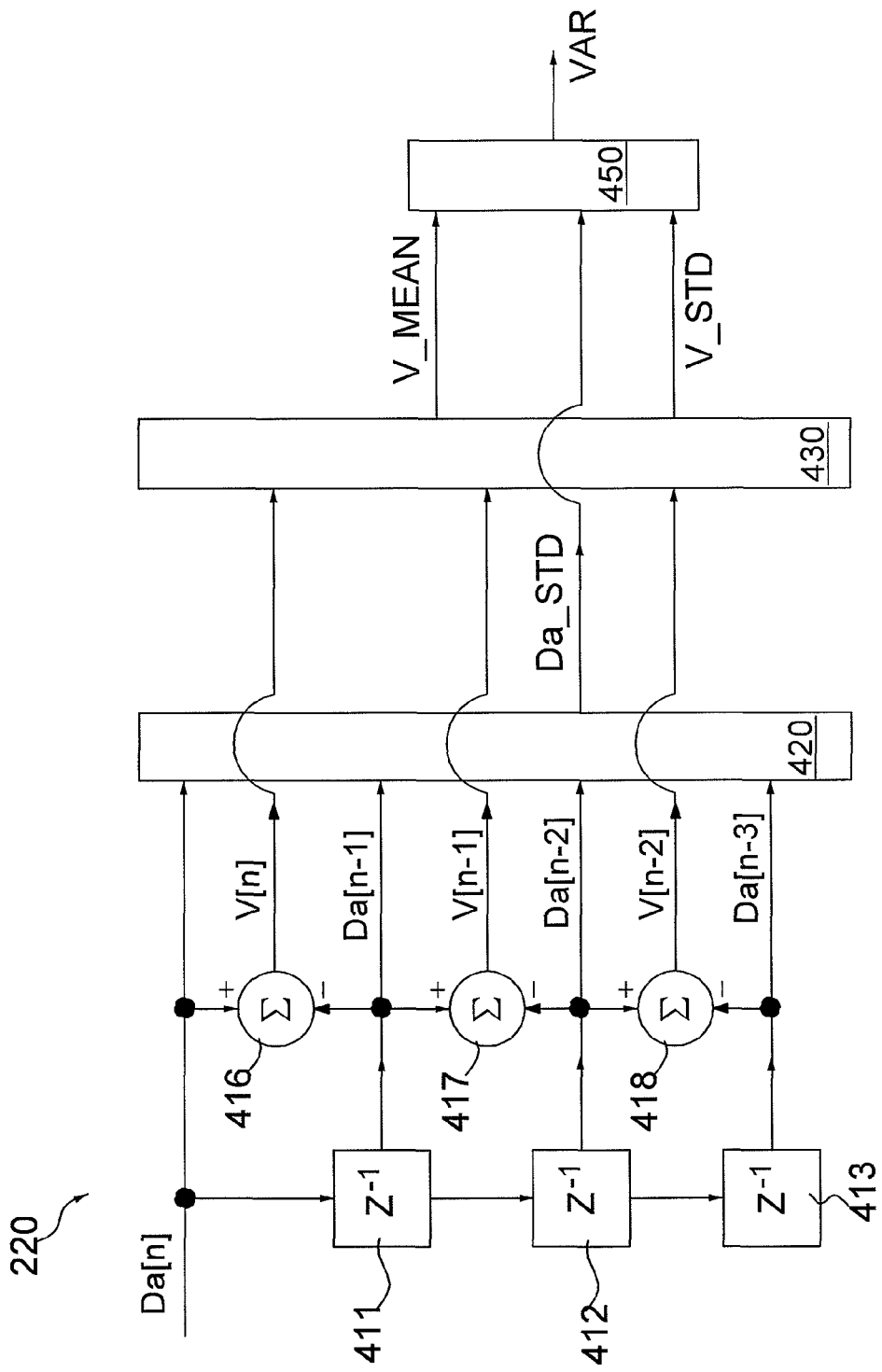
FIG. 4 shows a block diagram of a variation detector according to an embodiment of the invention.

FIG. 4 shows a block diagram of a variation detector according to an embodiment of the invention. After receiving the filtered signal Da[n] from the pre-lowpass filter 210, the variation detector 220 performs variation calculation and then generates a detection value VAR. In the embodiment of FIG. 4, the variation detector 220 performs variation calculation on four samples of the filtered signal Da[n]. It is noted that the number of the samples of the filtered signal Da[n] in FIG. 4 is illustrated by way of example but not by way of limitation. The hardware cost varies with the number of the samples of the filtered signal Da[n]. With more samples, the variation detector 220 needs to take more time to generate the detection value VAR. However, with less samples, the detection value VAR is subject to noise interference. Referring to FIG. 4, the variation detector 220 includes a first operation circuit 420, a second operation circuit 430, a third operation circuit 450, three delayers 411~413 and three subtractors 416~418.

The input signal Di[n] represents the finger touch position. The filtered signal Da[n] represents the finger touch position as well, but the noise of the filtered signal Da[n] has been eliminated by the pre-lowpass filter 210. Referring to FIG. 4, "$Z^{-1}$" is a delay notation, representing a delay by one sample in each of the delayers 411~413. Meanwhile, the outputs of the three subtractors 416~418 are given by:

the output of the subtractors 416: V[n]=Da[n]−Da[n−1];
the output of the subtractors 417: V[n−1]=Da[n−1]−Da[n−2];
the output of the subtractors 418: V[n−2]=Da[n−2]−Da[n−3].

Calculating the outputs of the three subtractors 416~418 is equivalent to calculating the first derivative of Da[n], Da[n−1], and Da[n−2]. The outputs of the three subtractors 416~418 represent three different speeds at three consecutive time instants. After receiving four samples Da[n], Da[n−1], Da[n−2] and Da[n−3] of the filtered signal, the first operation circuit 420 calculates the standard deviation of finger touch positions to generate a position standard deviation value Da_STD.

According to the definition of standard deviation, the position standard deviation value is given by:

$$Da\_STD = \left[\frac{1}{4}\sum_{m=0}^{3}(Da[n-m]-\overline{Da})^2\right]^{1/2},$$

where $\overline{Da}$ is the average position of the four samples (Da[n], Da[n−1], Da[n−2] and Da[n−3]). After receiving the outputs V[n], V[n−1] and V[n−2] from the three subtractors 416~418, the second operation circuit 430 calculates the standard deviation of finger speeds to generate a speed standard deviation value V_STD and an average speed value V_MEAN. According to the definition of standard deviation, the speed standard deviation value is given by:

$$V\_STD = \left[\frac{1}{3}\sum_{m=0}^{2}(V[n-m]-\overline{V})^2\right]^{1/2},$$

where $\overline{V}$, equal to V_MEAN, is the average speed of V[n], V[n−1] and V[n−2].

According to three parameters Da_STD, V_STD and V_MEAN, the third operation circuit 450 generates a detection value VAR. According to the invention, the detection value VAR is related to at least one of three parameters Da_STD, V_STD and V_MEAN or any combination thereof. In one embodiment, the third operation circuit 450 performs linear combination on three parameters Da_STD, V_STD and V_MEAN to generate a detection value VAR. In other words, VAR is a linear combination of Da_STD, V_STD and V_MEAN, i.e. VAR=w1×Da_STD+w2×V_STD+w3×V_MEAN, where w1=0.7, w2=0.2 and w3=0.1.

The above mentioned calculation of the standard deviation values is complex. In an alternate embodiment, to simplify calculation, the first operation circuit 420 calculates a sum of absolute difference (Da_SAD) of the finger positions according to an equation given by: Da_SAD=abs(Da[n]−$\overline{Da}$)+abs(Da[n−1]−$\overline{Da}$)+abs(Da[n−2]−$\overline{Da}$)+abs(Da[n−3]−$\overline{Da}$), where $\overline{Da}$ represents the average position of the four samples (Da[n], Da[n−1], Da[n−2] and Da[n−3]). The second operation circuit 430 calculates the SAD value (V_SAD) of the finger speeds according to an equation given by: V_SAD=abs(V[n]−$\overline{V}$)+abs(V[n−1]−$\overline{V}$)+abs(V[n−2]−$\overline{V}$, where $\overline{V}$ represents the average speed (V_MEAN) of V[n], V[n−1] and V[n−2]. According to three parameters Da_SAD, V_SAD and V_MEAN, the third operation circuit 450 generates a detection value VAR. According to the invention, the detection value VAR is related to at least one of three parameters Da_SAD, V_SAD and V_MEAN or any combination thereof. In one embodiment, the third operation circuit 450 performs linear combination on three parameters Da_SAD, V_SAD and V_MEAN to generate a detection value VAR. In other words, VAR is a linear combination of Da_SAD, V_SAD and V_MEAN, i.e. VAR=w1×Da_SAD+w2×V_SAD+w3×V_MEAN, where w1=0.6, w2=0.3 and w3=0.1.

The detection value VAR represents the variation magnitude of filtered signal Da[n]. The larger the detection value VAR, the larger the variation of the touch position. Accordingly, an IIR filter with a higher cut-off frequency can be used to achieve a faster response. By contrast, the smaller the detection value VAR, the smaller the variation of the touch position. Accordingly, an IIR filter with a lower cut-off frequency can be used to eliminate more noise.

Figure 5A:
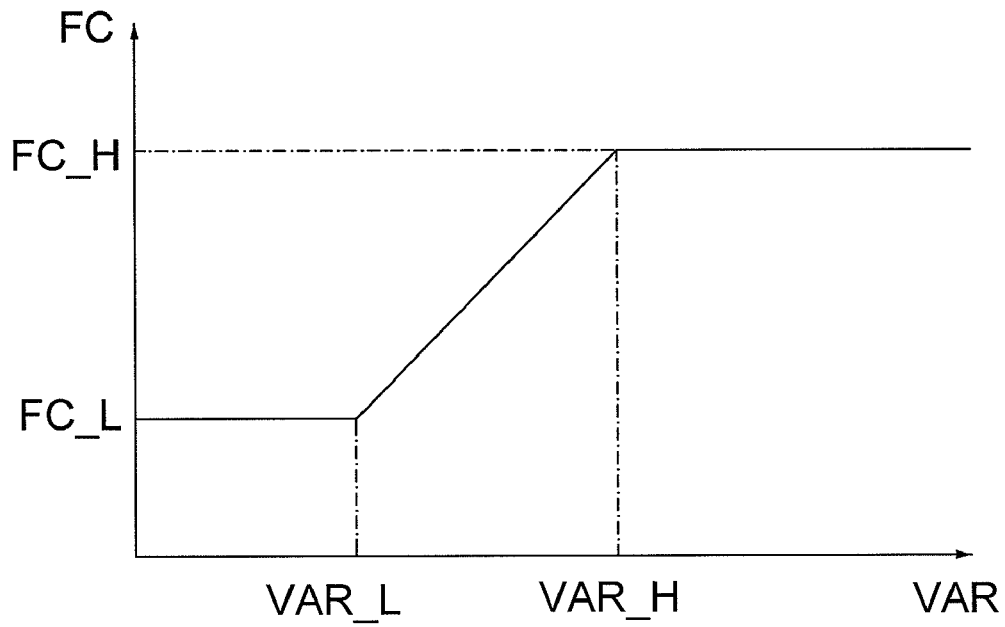
FIG. 5A is an exemplary graph showing a relation curve between a detection value VAR and a cut-off frequency FC.
Figure 5B:
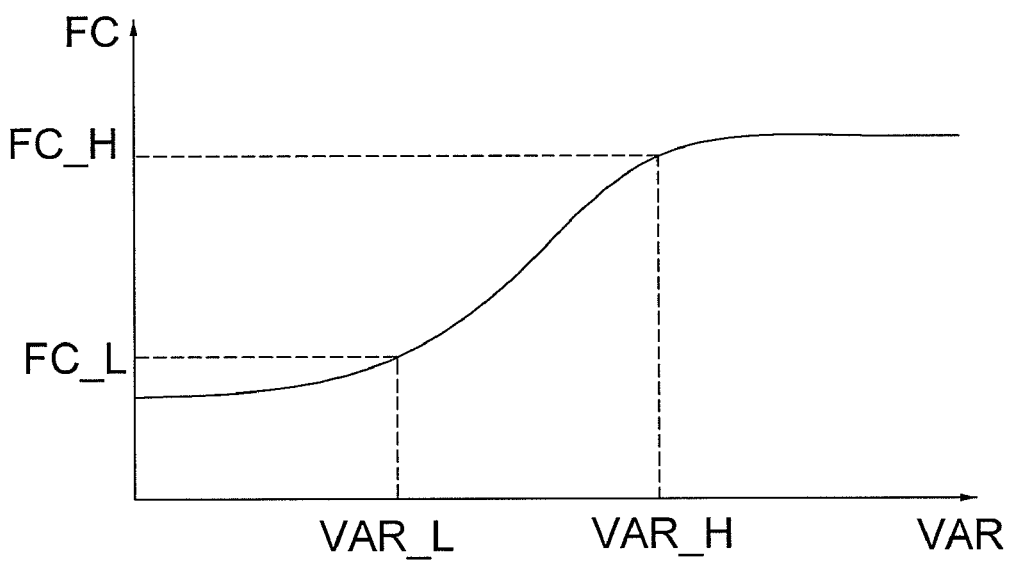
FIG. 5B is another exemplary graph showing a relation curve between a detection value VAR and a cut-off frequency FC.

Referring to FIG. 2, according to the detection value VAR, the coefficient generator 230 generates a set of filter coefficients. The coefficient generator 230 includes a first lookup table unit 231 and a second lookup table unit 232. The first lookup table unit 231 including an embedded first lookup table (LUT) is used to receive the detection value VAR and generate a cut-off frequency FC according to the first LUT. The first LUT is established according to the relation curve of the detection value VAR and the cut-off frequency FC in FIG. 5A. That is, the mapping relation between the detection value VAR and the cut-off frequency FC is implemented with the first LUT. When the detection value VAR is greater than VAR_H, the cut-off frequency FC outputted from the first lookup table unit 231 is equal to FC_H. When the detection value VAR is smaller than VAR_L, the cut-off frequency FC outputted from the first lookup table unit 231 is equal to FC_L. When the detection value VAR is smaller than VAR_H and greater than VAR_L, the cut-off frequency FC ranges between FC_H and FC_L. In the embodiment of FIG. 5A, when the cut-off frequency FC ranges between FC_H and FC_L, the relation between FC and VAR is linear and proportional. In another embodiment of FIG. 5B, when the cut-off frequency FC ranges between FC_H and FC_L, the relation between FC and VAR is nonlinear. As can be observed from the relation curves in FIGS. 5A and 5B, FC monotonically increases with VAR.

Figure 5C:
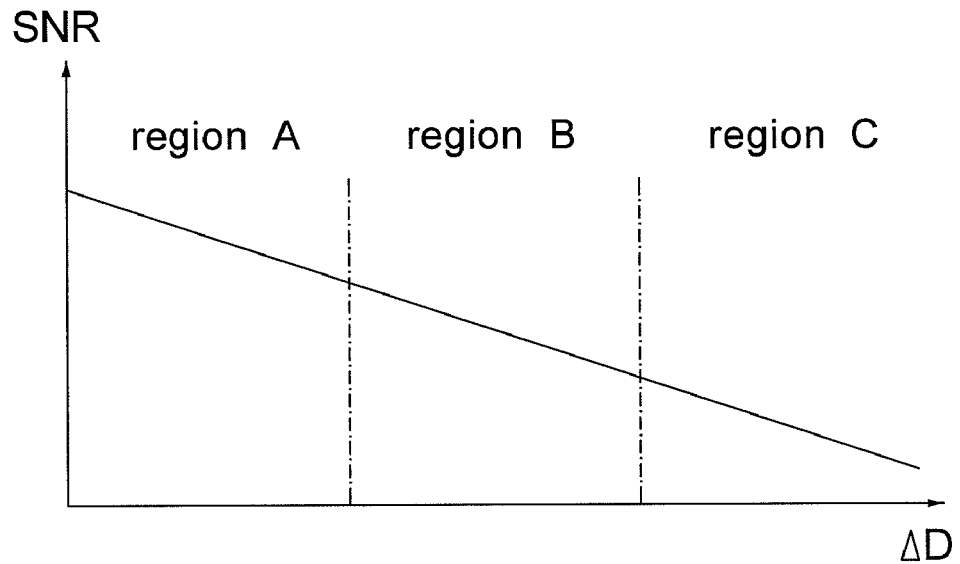
FIG. 5C illustrates a relation curve of distance and signal-to-noise ratio.
Figure 5D:
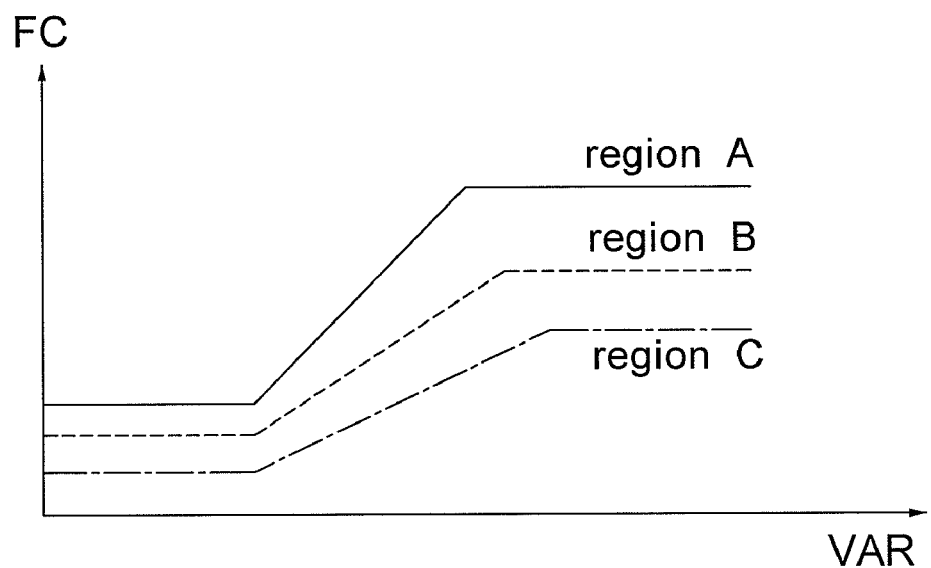
FIG. 5D illustrates each region has its own relation curve of distance and signal-to-noise ratio according to FIG. 5C.

In another embodiment, FC is a function of VAR and an environment variable. For example, given that the environment variable is a position signal D(x, y), different positions D(x, y) correspond to different relation curves of VAR and FC. FIG. 5C illustrates a relation curve of distance (ΔD) and signal-to-noise ratio (SNR). Referring to FIG. 5C, take touch positions on a touch panel for example. In general, the SNR of the position signal D(x, y) increases as a distance (ΔD) from a touch position to a touch sensor IC in the touch panel decreases, e.g. region A. The SNR of the position signal D(x, y) decreases as the distance (ΔD) from a touch position to the touch sensor IC increases, e.g. region C. In order to dynamically reflect different positions D(x, y) having different SNR values, the touch panel is divided into a plurality of regions and each of the regions can have its own relation curve in the above mentioned first LUT. Accordingly, the noise immunity of a region with a poor SNR is enhanced without sacrificing the response time of a region with a better SNR. Therefore, the above mentioned first LUT can suit the measure to local conditions. That is, in the first LUT, each of the plural relation curves can be designed according to the SNR value of its corresponding region as shown in FIG. 5D. For example, since the SNR is poor for region C, the relation curve of region C is below those of regions A and B. For the same detection value VAR, the FC value of the relation curve associated with region C is smaller those of regions A and B. In other words, if the relation curve associated with region C is selected, a lower FC value is used to suppress noise in region C. It should be noted that the detection value VAR is a necessary input for the first lookup table unit 231 to generate the cut-off frequency FC. However, the environment variable is an optional input for the first lookup table unit 231 and therefore shown in a dotted line in FIGS. 2 and 9.

Figure 6A:
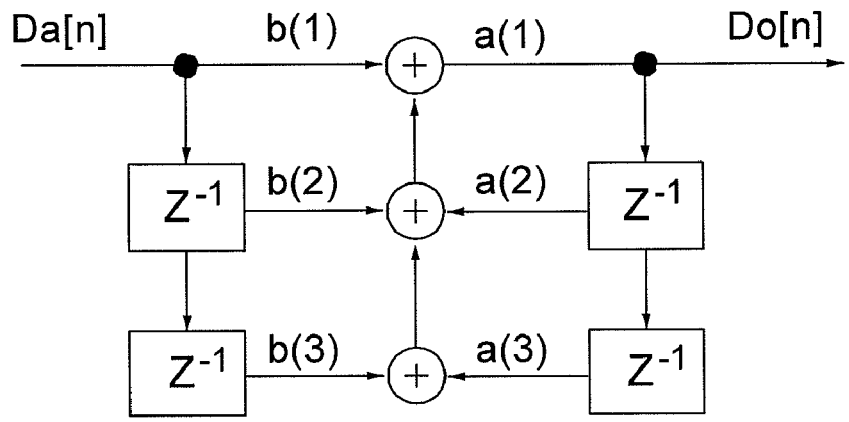
FIG. 6A is a signal flow graph of a second-order Chebyshev type 2 IIR filter having a direct form I structure.

In general, IIR filter structures are classified into a direct form I structure, a direct form II structure, a cascade form structure, a lattice form structure and a parallel form structure, and so forth. The invention is not limited to the structure and the order of the IIR filter 240. In the embodiment of FIG. 2, the IIR filter 240 is implemented with a second-order Chebyshev type 2 IIR filter having a direct form I structure as shown in FIG. 6A; besides, the stopband attenuation of the second-order Chebyshev type 2 IIR filter is set to −20 dB, indicating the voltage gain of frequencies above the cut-off frequency is below 1/10 (20 log 10(1/10)=−20 dB). FIG. 6A is a signal flow graph of a second-order Chebyshev type 2 IIR filter having a direct form I structure. Referring to FIG. 6A, the input and the output of the direct form I structure satisfy the following $2^{nd}$-order difference equation:

$$a(1) \times Do[n] = b(1) \times Da[n] + b(2) \times Da[n-1] + b(3) \times Da[n-2] - a(2) \times Do[n-1] \times a(3) \times Do[n-2] \quad (1).$$

After receiving the cut-off frequency FC, the second lookup table unit 232 including an embedded second lookup table (LUT) divides FC by FS to obtain a frequency ratio (FC/FS) (in units of pi (π)). Then, the second lookup table unit 232 retrieves a corresponding set of filter coefficients a(1), a(2), a(3), b(1), b(2) and b(3) (please refer to equation (1)) from the second LUT according to the frequency ratio (FC/FS). FIG. 6B shows an example of the second LUT. Referring to FIG. 6B, there are a total of nine frequency ratios (FC/FS) in the second LUT. The nine frequency ratios respectively correspond to nine sets of filter coefficients a(1), a(2), a(3), b(1), b(2) and b(3) in order to realize a second-order (n=2) Chebyshev type 2 IIR filter having a corresponding cut-off frequency, where a(1) is the coefficient of D0[n] and the a(1) value is equal to 1. In addition, the stopband ripple attenuation of the second-order (n=2) Chebyshev type 2 IIR filter is set to −20 dB. Compared with a Butterworth IIR filter, a Chebyshev type I IIR filter and an elliptic IIR filter, the second-order (n=2) Chebyshev type 2 IIR filter has attributes as follows. (1) The passband gain is equal to 1. (2) The stopband gain can be controlled below a preset value. (3) The transition region is relatively narrow. The above second-order (n=2) Chebyshev type 2 IIR filter is only utilized as embodiments and not limitation of the invention. Depending on circuit characteristics, a suitable IIR filter 240 can be implemented with one of the Butterworth filter, the elliptic filter, the Chebyshev type I filter, and the Chebyshev type 2 filter; in addition, a proper order of the IIR filter 240 is selected according to a required frequency response. In general, a higher-order filter has a narrower transition region, but more filter coefficients need to be stored in the second LUT. The circuit designer can realize IIR filters with different orders in view of the hardware cost and the requirements of circuit filtering.

Figure 6C:
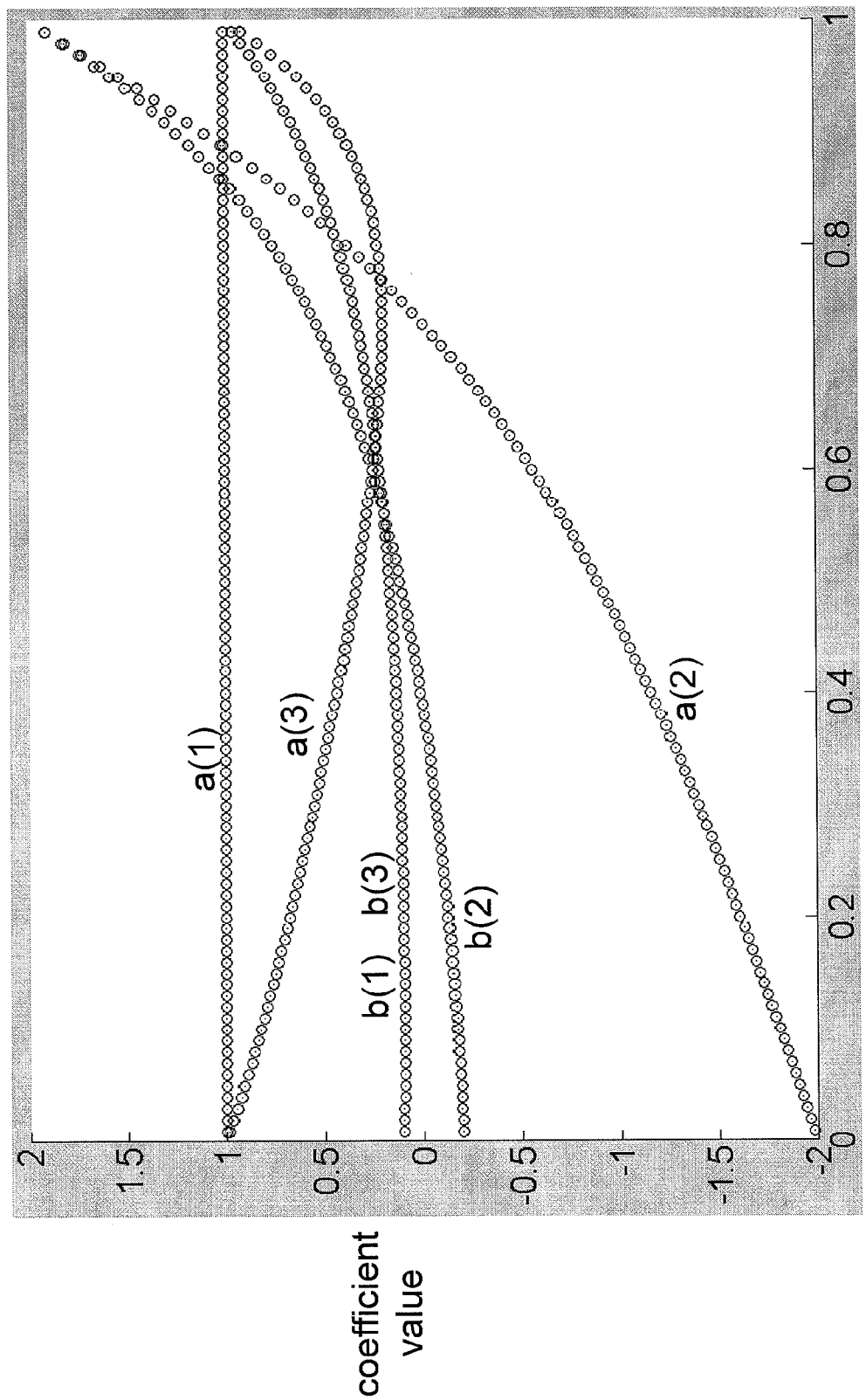
FIG. 6C shows a continuous data distribution among each of nine sets of filter coefficients in FIG. 6B.
Figure 7A:
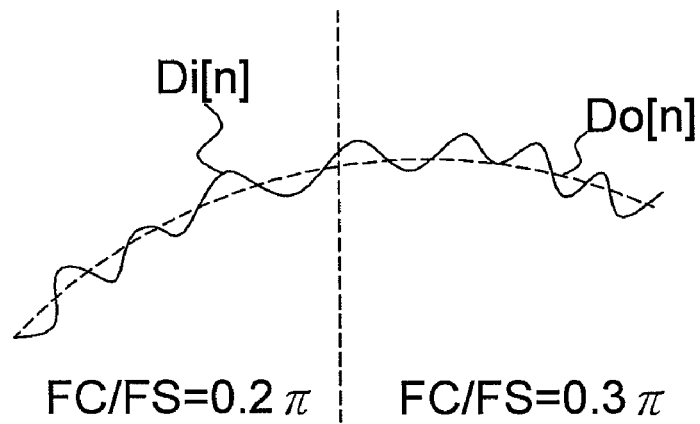
FIG. 7A show a relation between an input signal and an output signal when a frequency ratio is varied according to the invention.
Figure 7B:
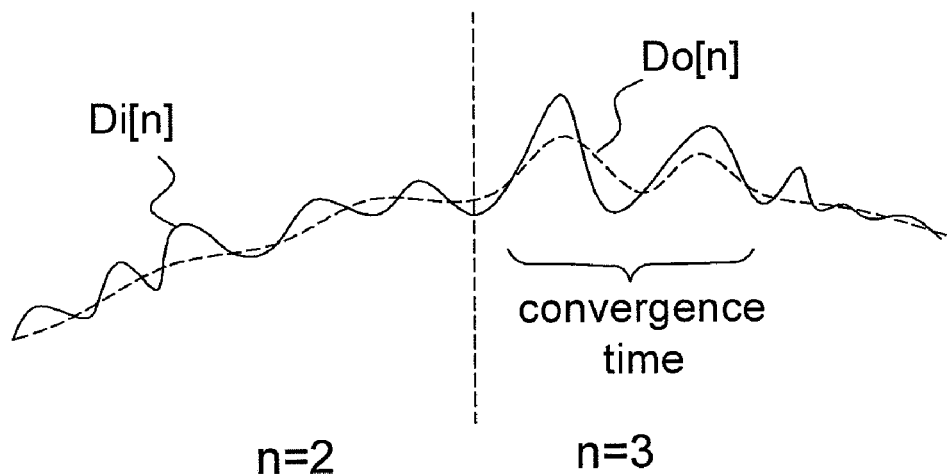
FIG. 7B show a relation between an input signal and an output signal when the order of a conventional filter is varied.

FIG. 6C shows a continuous data distribution among each of nine sets of filter coefficients in FIG. 6B. Apparently, as can be observed from FIG. 6C, a feature of the invention is that, corresponding to each frequency ratio (FC/FS), the data distribution among each set of filter coefficients is continuous for the same type and the same order of filter. The continuous data distribution gains the system the advantage as shown in FIG. 7A. Referring to FIG. 7A, when the frequency ratio (FC/FS) is varied from $0.2\pi$ to $0.3\pi$, the IIR filter 240 still remains in a converged state without an abrupt transition, e.g. oscillation or divergence. By contrast, conventional filters are subject to oscillation during the process of changing the order (e.g. from second-order to third-order) of the filter as shown in FIG. 7B. Moreover, according to the invention, the feature of the continuous data distribution has another advantage of simple calculation. Assuming that a calculated frequency ratio of $0.32\pi$ is between two neighboring preset frequency ratios in the second LUT of FIG. 6B, a set of filter coefficients associated with a frequency ratio of $0.32\pi$ can be generated by interpolation according to two sets of filter coefficients associated with its two neighboring preset frequency ratios (i.e., $0.3\pi$ and $0.4\pi$). Alternatively, a set of filter coefficients associated with a frequency ratio of $0.3\pi$, whose cut-off frequency is the closest to ($0.32\pi \times FS$), is selected as the set of filter coefficients associated with the frequency ratio of $0.32\pi$. On the other hand, each of the first lookup table unit 231 and the second lookup table unit 232 can be implemented with one of a read-only memory (ROM), a combinational logic circuit and a register circuit. Here, the register circuit includes a plurality of registers.

Figure 1A:
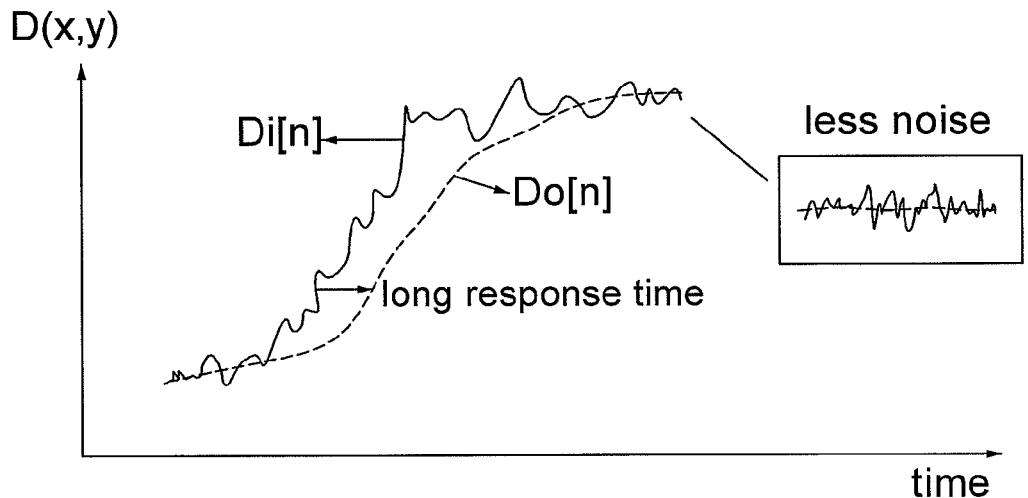
FIG. 1A illustrates a relation between an input signal and an output signal of a conventional filter.
Figure 1B:
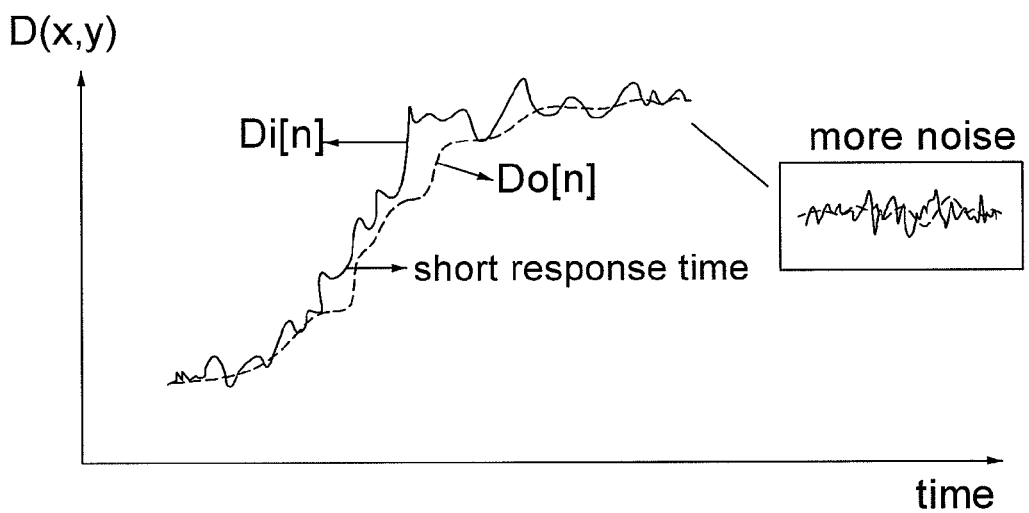
FIG. 1B illustrates a relation between an input signal and an output signal of another conventional filter.
Figure 8:
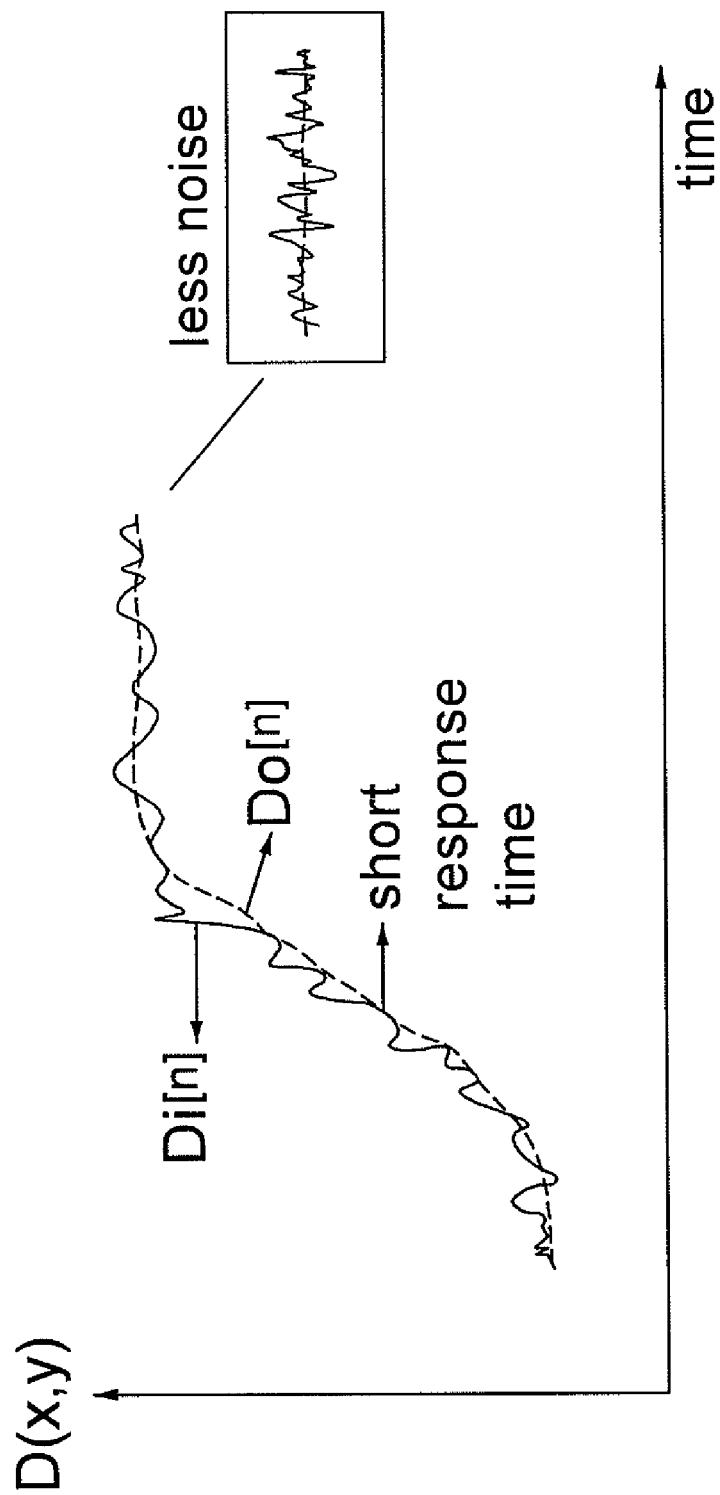
FIG. 8 shows a relation between the input signal and the output signal of a dynamic IIR filtering device of the invention.

The second lookup table unit 232 sends a corresponding set of filter coefficients a(1), a(2), a(3), b(1), b(2) and b(3) to the IIR filter 240, and then the IIR filter 240 performs filtering operations on the input signal Di[n] according to the set of filter coefficients. If the cut-off frequency corresponding to the set of filter coefficients is higher, the IIR filter 240 will respond faster; if the cut-off frequency corresponding to the set of filter coefficients is lower, the IIR filter 240 can eliminate more noise. Accordingly, the dynamic IIR filtering device 200 of the invention modifies the corresponding filter coefficients according to the variation of the input signal. Therefore, the cut-off frequency of the IIR filter 240 is dynamically adjusted to reach the best effect between two ultimate goals, i.e. noise elimination and fast response. FIG. 8 shows a relation between the input signal and the output signal of a dynamic IIR filtering device of the invention. Referring now to FIGS. 1A, 1B and 8, compared to conventional filters, the dynamic IIR filtering device 200 of the invention has a fast response characteristic in an abruptly increasing region of the output signal with large position variations, and a good SNR in a relatively flat region of the output signal with small position variations.

Figure 9:
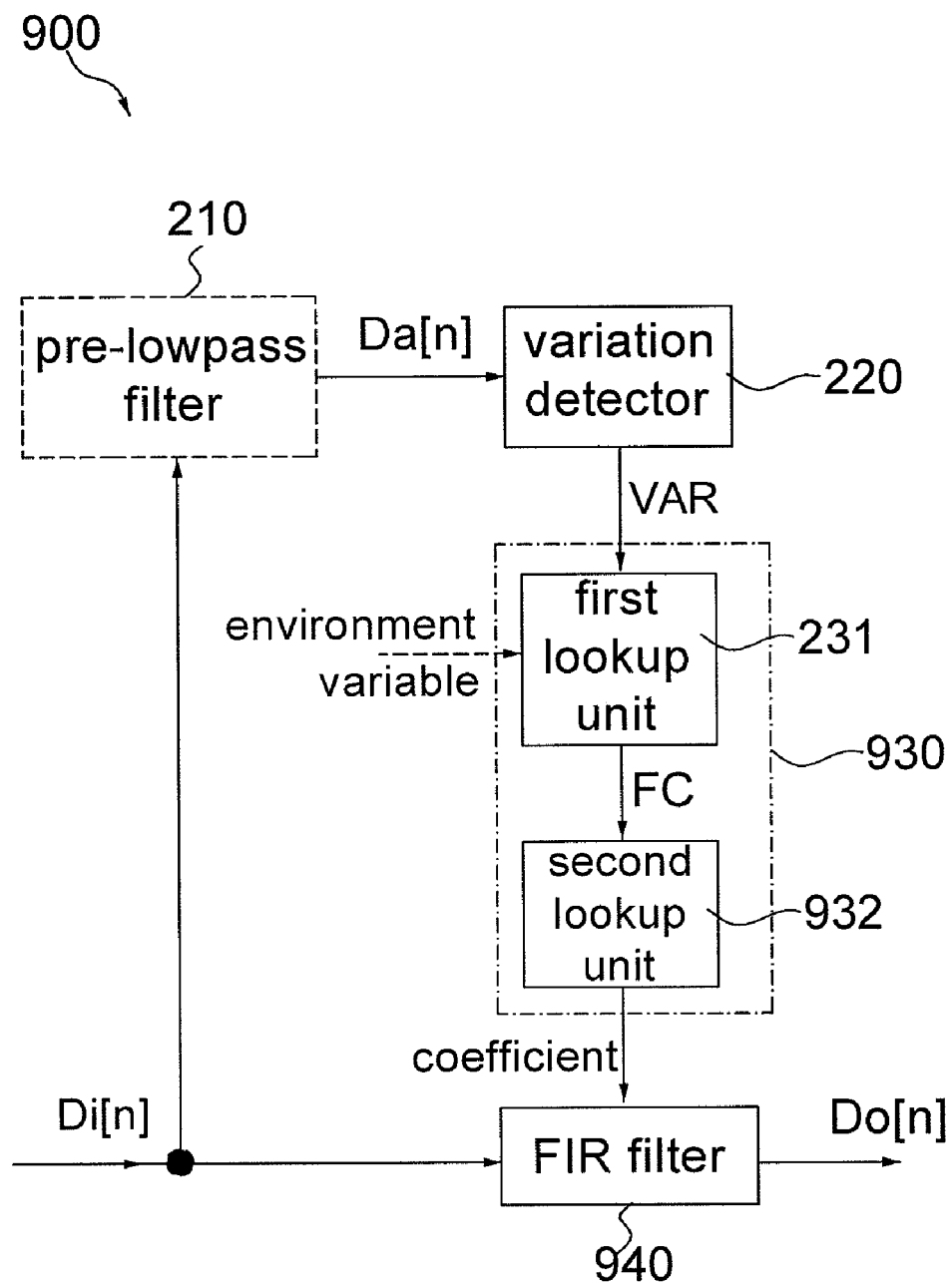
FIG. 9 shows a block diagram of a dynamic FIR filtering device according to an embodiment of the invention.

FIG. 9 shows a block diagram of a dynamic FIR filtering device according to one embodiment of the invention. Referring to FIG. 9, a dynamic FIR filtering device 900 of the invention includes a pre-lowpass filter 210, a variation detector 220, a coefficient generator 930 and an FIR filter 940. In this specification, elements which have the same numeral have the same function, and thus will not be described again. The differences between the embodiments of FIGS. 2 and 9 are described as follows.

In general, FIR filter structures are classified into four categories: type I FIR filters, type II FIR filters, type III FIR filters and type IV FIR filters. A type I FIR filter is defined as one that has a symmetric impulse response $$Di[n]=Di[M-n], 0 \leq n \leq M \tag{2}$$

where M is an even integer. A type II FIR filter has a symmetric impulse response as in equation (2), with M an odd integer. A type III FIR filter is defined as one that has an anti-symmetric impulse response $$Di[n]=Di[M-n], 0 \leq n \leq M \tag{3}$$

where M is an even integer. A type IV FIR filter has an anti-symmetric impulse response as in equation (3), with M an odd integer.

Figure 10A:
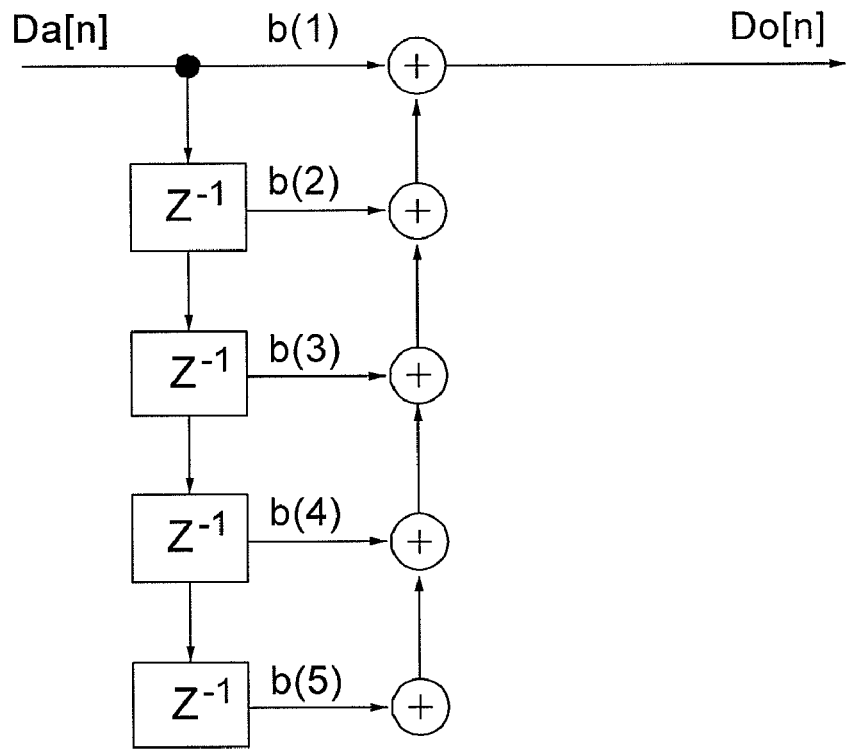
FIG. 10A is a signal flow graph of a fourth-order type I FIR filter having a direct form structure.

The invention is not limited to the structure and the order of the FIR filter 940. Depending on circuit characteristics, a suitable FIR filter is selected from type I FIR filter, the type II FIR filter, the type III FIR filter and the type IV FIR filter; in addition, a proper order is selected according to a required frequency response. In the embodiment of FIG. 9, the FIR filter 940 is implemented with a fourth-order (n=4) type I FIR filter having a direct form structure, as shown in FIG. 10A. Referring to FIG. 10A, the input and the output of the fourth-order (n=4) type I FIR filter having a direct form structure satisfy the following $4^{th}$-order difference equation:

$$Do[n]=b(1) \times Da[n]+b(2) \times Da[n-1]+b(3) \times Da[n-2]+b(4) \times Da[n-3]+b(5) \times Da[n-4] \tag{4}$$

After receiving the cut-off frequency FC, the second lookup table unit 932 including an embedded second lookup table (LUT) divides FC by FS to obtain a frequency ratio (FC/FS) (in units of pi($\pi$)). Then, the second lookup table unit 932 retrieves a set of corresponding filter coefficients b(1)-b(5) (referring to equation (4)) from the second LUT according to the frequency ratio (FC/FS). FIG. 10B shows another example of the second LUT. Referring to FIG. 10B, there are a total of nine frequency ratios (FC/FS) in the second LUT. The nine frequency ratios respectively correspond to nine sets of filter coefficients b(1)-b(5) in order to realize a $4^{th}$-order (n=4) type I FIR filter having a corresponding cut-off frequency. In general, a higher-order filter has a narrower transition region, but more filter coefficients need to be stored in the second LUT. A circuit designer can realize FIR filters with different orders in view of the hardware cost and the requirements of the circuit filtering.

Figure 10C:
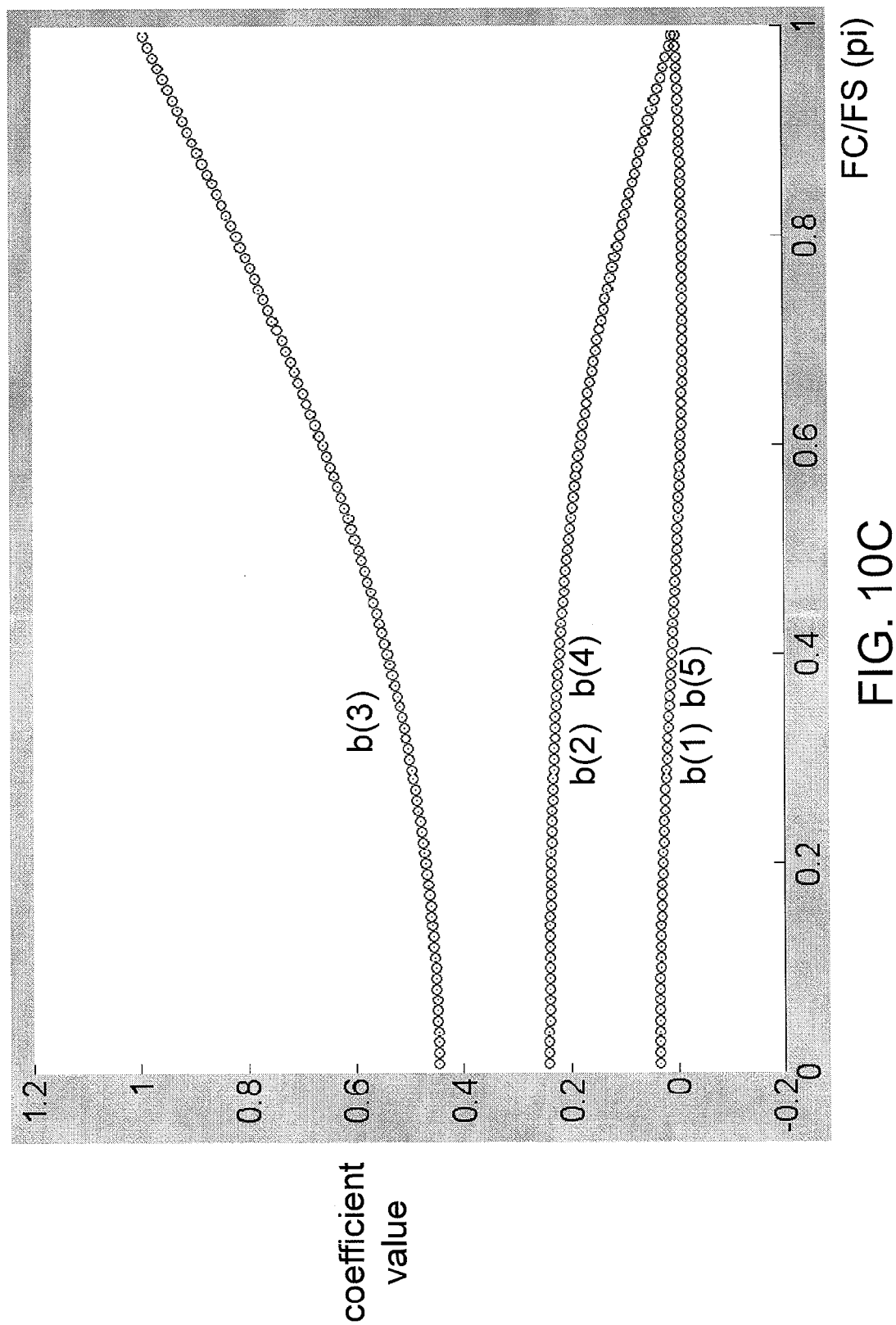
FIG. 10C shows a continuous data distribution among each of nine sets of filter coefficients in FIG. 10B.

FIG. 10C shows a continuous data distribution among each of nine sets of filter coefficients in FIG. 10B. Apparently, as can be observed from FIG. 10C, a feature of the invention is that, corresponding to each frequency ratio (FC/FS), the data distribution among each set of filter coefficients is continuous for the same type and the same order of filter. The second lookup table unit 932 sends a corresponding set of filter coefficients b(1)-b(5) to the FIR filter 940, and then the FIR filter 940 performs filtering operations on the input signal Di[n] according to the set of filter coefficients. If the cut-off frequency corresponding to the set of filter coefficients is higher, the FIR filter 940 will respond faster. By contrast, if the cut-off frequency corresponding to the set of filter coefficients is lower, the FIR filter 940 can eliminate more noise.

In all the above mentioned embodiments, the input signal Di[n] represents a touch position of the finger placed on the touch panel. That is, the measured value of the input signal Di[n] denotes a position or the coordinates of the touch position. Accordingly, the cut-off frequency of the filter (240 or 940) is dynamically varied according to the speed variations or/and the position variations or/and the average speed associated with the input signal Di[n]. Note that the dynamic filtering device and method thereof according to the invention can also be applied to other integrated circuits that need filtering operations. Thus, the measured value of the input signal Di[n] can represent various parameters in different application circuits, e.g. voltage values, luminance values, temperature values, current values and so on. Accordingly, the cut-off frequency of the filter (240 or 940) is varied according to the variations of the input signal Di[n], or/and the variations of first derivatives of the input signal Di[n], or/and the average of the first derivatives of the input signal Di[n]. Thus, a higher SNR is obtained while the variation of the input signal is small and the response time is reduced while the variation of the input signal is large, therefore improving the response time and the noise immunity. Correspondingly, the environment variable in each of FIGS. 2 and 9 is varied according to different application circuits, e.g. detection area, time period, humidity, temperature, distance, and so forth. The above environment variables and the above measured values of the input signal (Di[n]) are set forth by way of example and not limitations of the invention. In the actual implementation, any other environment variables and any other measured values of the input signal also fall in the scope of the invention.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A dynamic filtering device, comprising:
    a variation detector for generating a detection value according to a plurality of consecutive samples of a first signal;
    a coefficient generator for generating a corresponding set of filter coefficients according to the detection value; and
    a filer for performing filtering operations on the first signal in accordance with the corresponding set of filter coefficients;
    wherein the detection value is a linear combination of a variation of the plural consecutive samples, a variation of first derivatives of the plural consecutive samples and an average of the first derivatives of the plural consecutive samples; and
    wherein a magnitude of a cut-off frequency of the filter is related to the corresponding set of filter coefficients.

2. The device according to claim 1, wherein the variation of the plural consecutive samples is a standard deviation of the plural consecutive samples or a sum of absolute difference of the plural consecutive samples.

3. The device according to claim 1, wherein the variation of the first derivatives of the plural consecutive samples is a standard deviation of the first derivatives of the plural consecutive samples or a sum of absolute difference of the first derivatives of the plural consecutive samples.

4. The device according to claim 1, wherein the coefficient generator comprises:
    a first lookup unit comprising a first lookup table for receiving the detection value and generating the cut-off frequency according to the first lookup table; and
    a second lookup unit comprising a second lookup table for receiving the cut-off frequency and retrieving the corresponding set of filter coefficients from the second lookup table comprising a plurality of set of filter coefficients;
    wherein the cut-off frequency monotonically increases with the detection value.

5. The device according to claim 4, wherein a content of the second lookup table varies with the order of the filter.

6. The device according to claim 4, wherein a content of the second lookup table varies with the type of the filter.

7. The device according to claim 4, wherein a data distribution among each set of filter coefficients is continuous.

8. The device according to claim 4, wherein the first lookup unit further receives an environment variable to generate the cut-off frequency according to the first lookup table.

9. The device according to claim 1, wherein the filter is an infinite impulse response (IIR) filter.

10. The device according to claim 9, wherein the IIR filter is implemented with one of a Butterworth IIR filter, a Chebyshev type I IIR filter, a Chebyshev type 2 IIR filter and an elliptic IIR filter.

11. The device according to claim 1, wherein the filter is a finite impulse response (FIR) filter.

12. The device according to claim 11, wherein the FIR filter is implemented with one of a type I FIR filter, a type II FIR filter, a type III FIR filter and a type IV FIR filter.

13. The device according to claim 1, further comprising:
    a pre-lowpass filter for receiving a second signal and eliminating noise to generate the first signal.

14. A dynamic filtering method, comprising:
    obtaining a detection value according to a plurality of consecutive samples of a first signal;
    obtaining a corresponding set of filter coefficients according to the detection value; and
    using a filter to perform filtering operations on the first signal in accordance with the corresponding set of filter coefficients;
    wherein the detection value is a linear combination of a variation of the plural consecutive samples, a variation of first derivatives of the plural consecutive samples and an average of the first derivatives of the plural consecutive samples; and
    wherein a magnitude of a cut-off frequency of the filter is related to the corresponding set of filter coefficients.

15. The method according to claim 14, wherein the variation of the plural consecutive samples is a standard deviation of the plural consecutive samples or a sum of absolute difference of the plural consecutive samples.

16. The method according to claim 14, wherein the variation of the first derivatives of the plural consecutive samples is a standard deviation of the first derivatives of the plural consecutive samples or a sum of absolute difference of the first derivatives of the plural consecutive samples.

17. The method according to claim 14, wherein the step of obtaining the set of filter coefficients comprises:
    retrieving the cut-off frequency from a first lookup table according to the detection value; and
    retrieving the corresponding set of filter coefficients from a second lookup table comprising a plurality of sets of filter coefficients according to the cut-off frequency;

wherein the cut-off frequency monotonically increases with the detection value.

18. The method according to claim 17, wherein a content of the second lookup table varies with the order of the filter.

19. The method according to claim 17, wherein a content of the second lookup table varies with the type of the filter.

20. The method according to claim 17, wherein a data distribution among each set of filter coefficients is continuous.

21. The method according to claim 17, wherein the step of retrieving the cut-off frequency further comprises:
   retrieving the cut-off frequency from the first lookup table according to an environment variable.

22. The method according to claim 14, wherein the filter is an infinite impulse response (IIR) filter.

23. The method according to claim 22, wherein the IIR filter is implemented with one of a Butterworth IIR filter, a Chebyshev type I IIR filter, a Chebyshev type 2 IIR filter and an elliptic IIR filter.

24. The method according to claim 14, wherein the filter is a finite impulse response (FIR) filter.

25. The method according to claim 24, wherein the FIR filter is implemented with one of a type I FIR filter, a type II FIR filter, a type III FIR filter and a type IV FIR filter.

26. The method according to claim 14, further comprising:
   eliminating noise of a second signal to obtain the first signal by using a pre-lowpass filter.

* * * * *